United States Patent [19]

Sinz et al.

[11] Patent Number: 4,888,686

[45] Date of Patent: Dec. 19, 1989

[54] SYSTEM FOR STORING INFORMATION WITH COMPARISON OF STORED DATA VALUES

[75] Inventors: Wolfgang Sinz, Hofheim; Günther Kotulla, Sulzbach, both of Fed. Rep. of Germany

[73] Assignee: VDO Adolf Schindling AG, Frankfurt am Main, Fed. Rep. of Germany

[21] Appl. No.: 944,255

[22] Filed: Dec. 19, 1986

[30] Foreign Application Priority Data

Jan. 24, 1986 [DE] Fed. Rep. of Germany ....... 3602112

[51] Int. Cl.⁴ ............................................. G06F 11/14
[52] U.S. Cl. .................................. 364/200; 364/244.4; 364/265.3; 364/266.5; 364/222.4; 365/228
[58] Field of Search ... 364/200 MS File, 900 MS File; 365/228

[56] References Cited

U.S. PATENT DOCUMENTS

| | | | |
|---|---|---|---|
| 4,402,057 | 8/1983 | Itou et al. | 364/900 |
| 4,484,307 | 11/1984 | Quatse et al. | 364/900 |
| 4,493,083 | 1/1985 | Kinoshita | 371/66 |
| 4,651,307 | 3/1987 | Toumayan et al. | 365/228 |

Primary Examiner—Gareth D. Shaw
Assistant Examiner—Maria Napiorkowski
Attorney, Agent, or Firm—Martin A. Farber

[57] ABSTRACT

In a system for the storing of information, having a non-volatile memory comprising a plurality of memory locations, information is stored in each case in succession in two memory locations, an uneven number of which are utilized in cyclic sequence. Upon a reading after reconnection, the information is read out from, in each case, two adjacent memory locations, advancing in each case by one memory location, and tested for agreement. From the sequence of agreements and disagreements, the memory location having the valid information is determined. For the checking of the connection between a processor and the non-volatile memory, the information of at least one additional memory location is read out from time to time and new information is then written into the further memory location, which information is thereafter read. The new information and the previous information are compared with each other. If they agree then there is a disturbance in the connection.

10 Claims, 3 Drawing Sheets

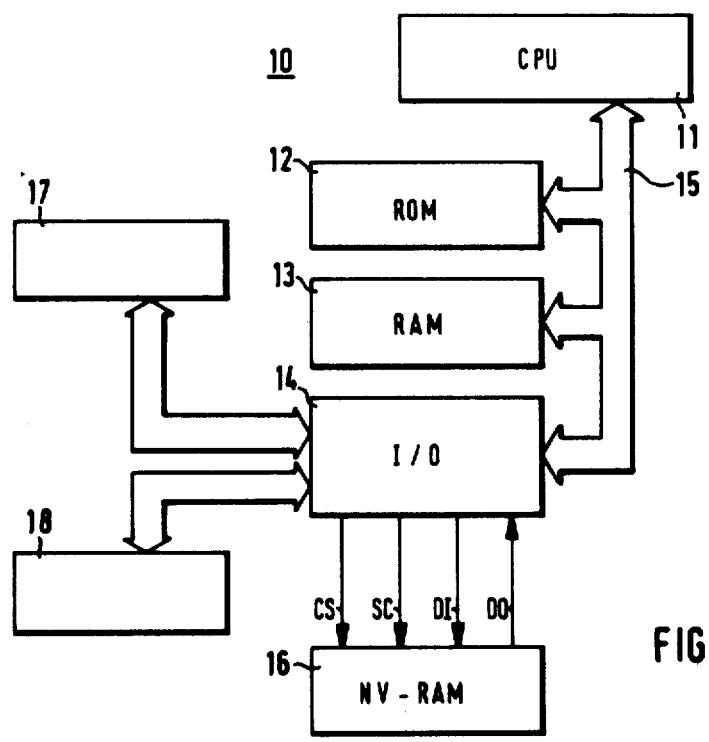
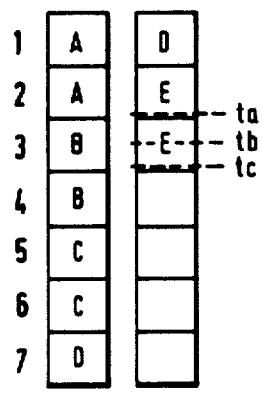
FIG. 2
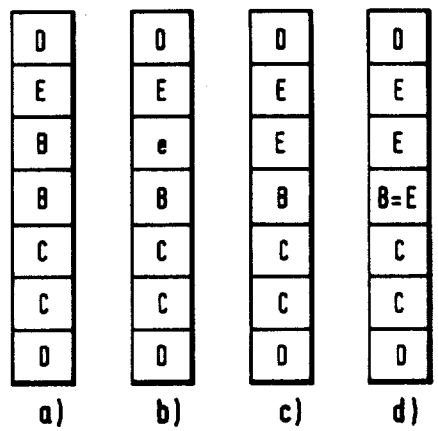
FIG. 3

4,888,686

SYSTEM FOR STORING INFORMATION WITH COMPARISON OF STORED DATA VALUES

FIELD AND BACKGROUND OF THE INVENTION

The present invention relates to a system for storing information, having a non-volatile memory comprising a plurality of memory locations.

In data processing systems it is frequently necessary to store information also over periods of time during which the system in question is not supplied with operating voltage. For this, in addition to storage by means of buffered readwrite memories, storage by means of so-called non-volatile memories has proven suitable. The maximum number of recordings per memory location is limited in the non-volatile memories presently available. Therefore, non-volatile memories are frequently used in which the information to be stored is recorded one after the other in different memory locations. In this connection it must, however, be made certain that the last data recorded is recovered after the system is again turned on. Finally, assurance must be had that in the event of a failure of the operating voltage during a writing process the last completely written data is considered valid data upon reconnection and is processed further.

SUMMARY OF THE INVENTION

It is an object of the present invention to provide a system for the storing of information which satisfies the above conditions.

According to the invention, in each case information is recorded in succession in two memory locations and an odd number of the memory locations is used in cyclic sequence.

The system of the invention has the advantage that the memory locations of a non-volatile memory are "used up" uniformly, that the conditions are created for the information last entered to be recovered and that a last valid entry is recorded and recovered even in the event of a sudden failure of the operating voltage.

Advantageous use can be made of the invention particularly in electronic display systems such as, for instance, displays in automotive vehicles. Thus, for instance, the result of an electronic measurement of the level of filling of an automobile tank can be stored by the system of the invention.

In accordance with a further development of the invention, the data are measured values, a measured value being displayed after it has been entered in the first memory location and then being written into the second memory location. In this way, it is made possible for the measured value which has been displayed prior to the disconnection to be displayed again upon reconnection.

A system for the reading of data from a non-volatile memory which comprises a plurality of memory locations is characterized by the fact that, after reconnection, the data are read out from in each case two adjacent memory locations, proceeding one memory location at a time, and tested for agreement, and that the memory location containing the valid information is determined on the basis of the sequence of the agreements and disagreements. By means of this further embodiment of the invention it is readily possible without further measures, to recognize the valid measurement value which was last read into the memory before the failure of the operating voltage and display it or otherwise process it.

Further according to the invention, the address, a, of the memory location containing valid data is determined from the sequence of the agreements and disagreements by means of the equation $a = j - 1 + x$, in which j is the address of the next-to-the-last-memory position addressed and x, in the event of two disagreements and a single agreement, is equal to 0, in the case of three disagreements is equal to $-2$ and in the case of two agreements is equal to $-1$, and that in the case of other sequences, memory locations are checked for agreement with, in each case, addresses increased by 1.

Still further, the valid data is entered in the following memory location.

Yet further, the data is a measured value to be displayed and is fed to a display device before entry in a subsequent memory location.

Furthermore, a system for the storing and/or reading of data with a non-volatile memory comprising a plurality of memory locations and a processor is characterized by the fact that, in order to check the connection between the processor and the non-volatile memory, the data of at least one memory location are read from time to time and thereupon new data are recorded into the memory location, which data is thereupon read; that the new data and the previous data are compared with each other and, if they disagree, a fault in the connection has been detected. In this way, it is possible at very little expense to continuously check the connection between the processor and the non-volatile memory in order, in particular, to make certain that important data which are to be entered into the non-volatile memory are not unrecognized, and are secured in this manner.

In accordance with a further development of the invention, data which are to be stored cyclically are read into further memory locations of the non-volatile memory and the checking of the connection is effected once during each cycle.

The invention permits of numerous embodiments.

BRIEF DESCRIPTION OF THE DRAWINGS

With the above and other objects and advantages in view, the present invention will become more clearly understood in connection with the detailed description of preferred embodiments, when considered with the accompanying drawings, of which:

FIG. 1.is a block diagram of a system in accordance with the invention;

FIG. 2 shows diagrammatically the occupation of the memory locations of a non-volatile memory in a system according to the invention during a plurality of writing cycles;

FIG. 3 shows the occupation of the memory locations after reconnection;

DETAILED DESCRIPTION OF THE PREFERRED EMBODIMENTS

Figure 4:
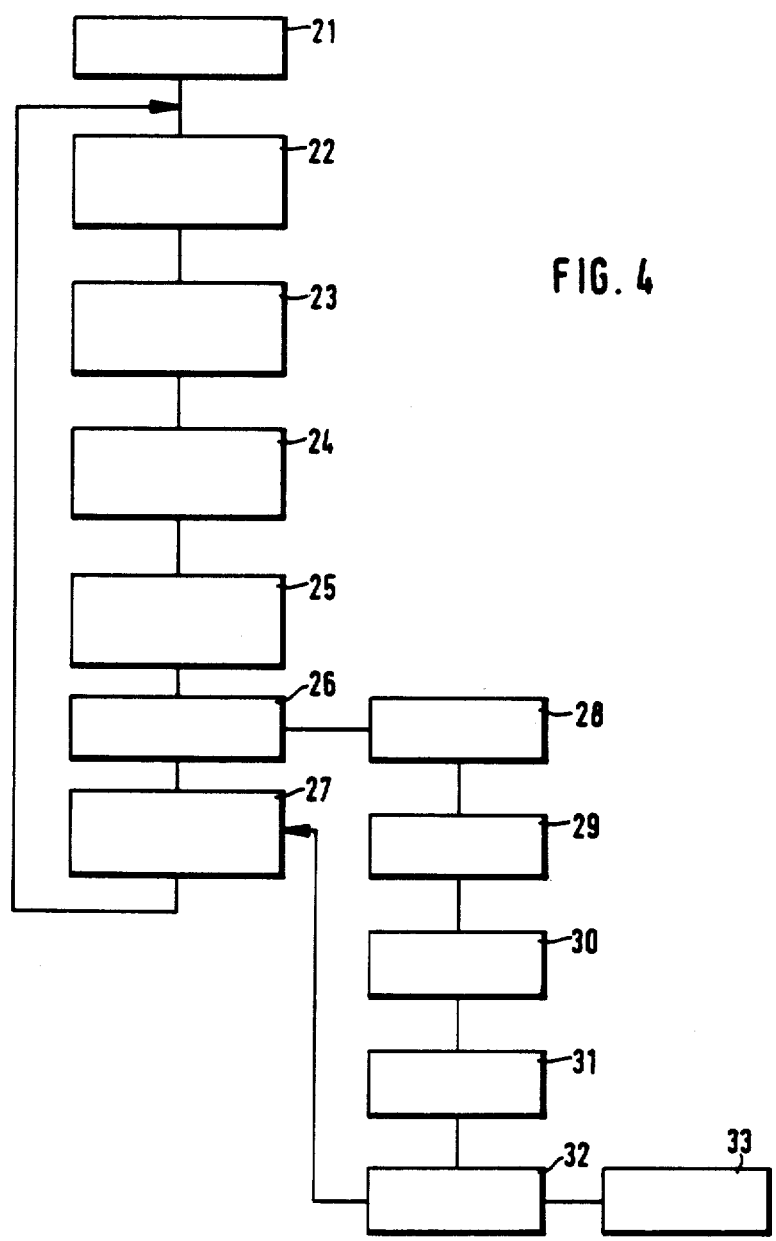
FIG. 4 is a flowchart of a first part.

Identical parts are provided with the same reference numbers in the figures.

In the system shown as a block diagram in FIG. 1, a microcomputer 10, developed, for instance, as a single-chip computer, comprises a processor 11, a non-volatile memory 12, a read-write memory 13 and an input/output device 14, which are connected to each other by a bus system 15.

A non-volatile memory 16 is connected to the microcomputer 10. The connection is effected via the lines DI (data input), DO (data output), CS (chip select) and SC (serial clock). An acquisition unit 17 and a display device 18 are furthermore connected to the input/output 14.

Depending on the purpose of use of the system shown, the acquisition unit 17, the display 18 and the program stored in the non-volatile memory 12 can be developed differently. Thus, for instance, the system shown in FIG. 1 can be used to indicate the level of fuel in a fuel tank of an automotive vehicle, the acquisition unit 17 being formed of a suitable sensor system, while the display device 18 is, for instance, a liquid-crystal display. The microcomputer 10 now currently evaluates the signals produced by the sensor system 17 and causes them to be displayed. In order that after a pause in the operation of the vehicle the same level of filling is shown immediately upon restarting as before the disconnection, non-volatile memory 16 is provided. The invention now provides assurance that, on the one hand, in order to obtain a sufficiently long life, a plurality of memory cells can be operated in cyclic sequence, the measured value last valid being recognized, without further measures, upon reconnection. On the other hand, assurance is provided that the last valid measured value is recognized even upon an uncontrolled disconnect, for instance during the writing of a measured value.

The operation of the system of the invention will be explained below with reference to FIGS. 2 and 3 which diagrammatically show the occupation of the memory locations of the non-volatile memory. During the operation of the system of FIG. 1, the memory locations 1 to 7 of the nonvolatile memory 16 shown diagrammatically in FIG. 2 are written in succession with the measured values. A measured value is written into the memory as soon as it is determined and then displayed, whereupon it is written into the following memory location of the memory. Accordingly, the following course forms the basis of the showing of FIG. 2:

A measured value A has been written into memory locations 1 and 2 and, as soon as the variable to be measured has changed, the new measurement value B is written into memory locations 3 and 4, followed by a measured value C in memory locations 5 and 6 and a measured value D into memory location 7 and—due to the uneven number of memory positions—in the memory location 1. The measured value E is then written into the memory locations 2 and 3, etc.

The non-volatile memories available on the market generally have an even number, preferably a multiple of 8. By suitable programming, however, a memory location can be skipped upon the cyclic exchange.

Showings (a), (b) and (c) in FIG. 3 show the contents of the memory locations 1 to 7 of the non-volatile memory after disconnection at different times. FIG. 3a shows the contents of the memory locations when the system has been disconnected after the writing of the information E into the memory location 2 (time ta).

FIG. 3b shows the contents of the memory locations when the system has been disconnected during the writing in the memory location 3 (time tb), so that upon the second writing of the information E, merely garbled information e has been written into the memory location 3. The showing in FIG. 3c presupposes that the system was disconnected after the second writing of the information E at tc.

Finally, FIG. 3d shows a special case in which the information or measured value E corresponds to the measured value B, so that, after disconnection during the times designated by ta and tc respectively, three identical pieces of information are present in the memory cells 2, 3 and 4.

The flowchart of FIG. 4 shows the entry of the values into the non-volatile memory 16 (FIG. 1) in accordance with the scheme shown in FIG. 2. After the determination of the different timings in 21, the old value in the memory location or cell z is erased at 22. The new value is stored at 23 in cell z and displayed at 24 (FIG. 1, display device 18). The same value is then written into the cell z+1 at 25. At 26 a check is made as to whether a given cell, for instance cell 1, has been written to. If not, the program is continued at 27. Among other tings, z is increased by 2. Assuming the use of a non-volatile memory having 16 cells or memory locations, the increase in the address counter at z by, in each case, 2 is effected in the manner that cell 16 is skipped. Therefore, cell 15 is followed by cell 1. Furthermore, it is seen to it within the part 27 of the program that the program shown in FIG. 4 for the entry of the values is continued or repeated at 22 only when a new measured value is present.

If it is noted at 26 that cell 1 has been written to, then the program is continued at 28. The content of cell 16 is read at 28 and then erased at 29. The microcomputer 10 (FIG. 1) then determines a new value for the cell 16, which value is written at 30 into cell 16. The new content is read again out of cell 16 at 31 and compared with the old content at 32. If the two values agree, it can be concluded that there was an interruption in the connections between the microcomputer and the non-volatile memory. The error is displayed at 33. If the two values are different, the program is continued at 27.

Figure 5:
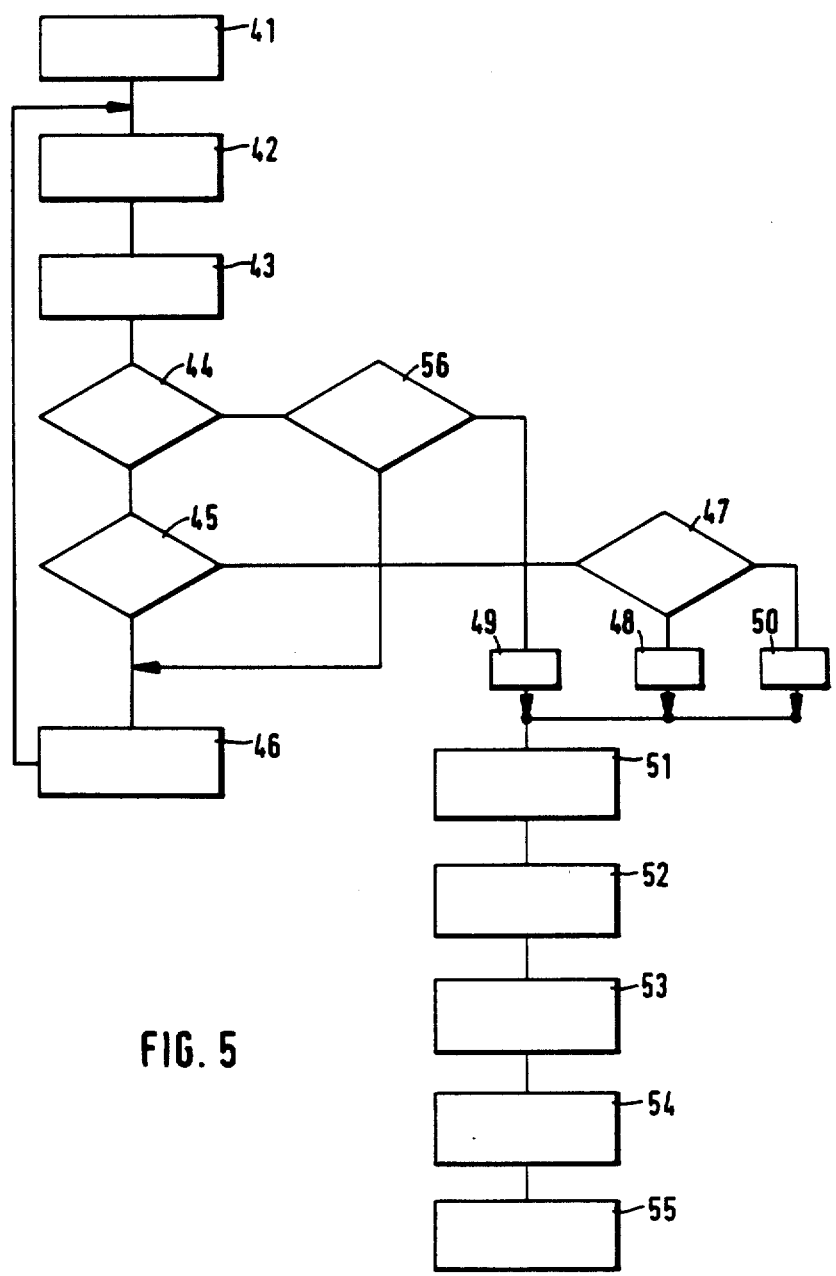
FIG. 5 of a second part of the program stored in the microcomputer.

FIG. 5 shows a part of the program stored in the microcomputer 10, with which program a measured value which was written last into the non-volatile memory prior to the disconnection is determined and read. A starting address of the cell to be checked first, for instance the cell 1, is loaded at 41 into the working memory of the microcomputer. The content of this cell is read at 42, whereupon the content of the cell having the next following address is read at 43. The two contents are compared with each other in the part 44 of the program. If they are different the program is continued at the branch 45 by means of which it is decided whether the contents of two successive cells are different two times. If this is not the case, it can be concluded that no value recorded last before the disconnect is present. The address for the next cell is then determined at 46 and the program is continued with the reading of this cell at 42.

However, if the content of two adjacent cells differs twice, one after the other, the program, commencing from the branch 45, is continued at the branch 47. Here it is decided whether disagreements are also present a third time between adjacent cells. Thus, for instance, in the case of the content shown in FIG. 3a, a disagreement is noted between cell 1 and cell 2, i.e. the program is conducted from the branch 44 to the branch 45. A disagreement is also noted from cell 2 to cell 3 so that the program leaves the branch 45 with "yes." It is then determined at 47 that inequality is not present a third time (cells 3 and 4 each have the content B), whereupon the value x is set equal to zero at 48. At 51, the address is then determined of that cell in which the last valid value was entered before a disconnection or some other interruption of the operating voltage. In the case of the example shown in FIG. 3, this is the address of cell 2. The value read from cell 2 is then displayed at 52. The same value E is then entered into the following cell at 53 so that the sequence of, in each case, two entries of the same value is retained for the further operation. Thereupon, the next measurement value is written into the next-but-one cell at 54, as has been explained in connection with FIG. 4. The further course of the program is indicated at 55.

In the case of the memory occupation shown in FIG. 3b) it is assumed that the writing process has been interrupted at the time tb, so that the information E has been written only in garbled form as information e in the cell 3. Upon the checking of the contents it is found that a disagreement in the contents appears three times, one after the other. The program leaves the branch 47 at "yes," whereupon the value x is set equal to −2 at 50. The address having the last valid value, namely the address of cell 2, is then again determined in the program part 51. In the case shown in FIG. 3c) the operating voltage was disconnected after the second recording of the value E. By means of the program part shown in FIG. 5 a disagreement is noted two times. The branch 47 is left at "no," and the value x is placed equal to zero at 48 and the address determined at 51.

The case shown in FIG. 3d is present if the measured value to be stored assumes the same value after, for instance, passage through the memory locations. In this case it is assumed that E is equal to B. After disconnection at ta or tc, the same content is present in cells 2, 3 and 4. This is recognized by means of the branch 56 since in this case the contents of two excessive cells are the same two times in succession. The value x is then placed equal to −1 at 49 and the address 51, in this case for cell 2, is determined.

We claim:

1. A system for storing information, comprising:

a non-volatile memory having a plurality of memory locations, the information to be stored comprising a succession of data values; and storing means for storing a data value repetitively at a first time and a second time respectively in a first and a second memory location of a series of memory locations in said non-volatile memory, a subsequent one of said data values being stored repetitively by said storing means at further times in a further two successive memory locations, there being an odd number of memory locations in said series; and wherein after a storing of data values in all the locations of said series, storing of a further data value is accomplished by replacing the value of said first location with said further data value, whereby said plurality of memory locations are reused for further of said data values in cyclic sequence, the storing of repetitive data values at a plurality of differing times preserving the information from a disruption of said system occurring during any one of said differing times; said system further comprising comparator means connecting with said non-volatile memory for comparing information of one of said memory locations with information of a second of said memory locations to determine a presence of twice-repeated data values in said series of memory locations; and readout means operative in response to said comparator means for obtaining from said non-volatile memory a last stored value of said data values from a series of said succession of data values, said last value being independent of said system disruption.

2. The system according to claim 1, wherein the data values are measured values, said system including means for displaying a measured value after it has been entered in a first of the memory locations, the measured value then being written into a second of the memory locations by said storing means.

3. A system for storing information, comprising:

a non-volatile memory having a plurality of memory locations, the information to be stored comprising a succession of data values; and storing means for repetitively storing a data value in a first and a second memory location of a series of memory locations in said non-volatile memory, a subsequent one of said data values being stored repetitively by said storing means at further times in a further two successive memory locations, there being an odd number of memory locations in said series; and wherein after a storing of data values in all the locations of said series, storing of a further data value is accomplished by replacing the value of said first location with said further data value, whereby said plurality of memory locations are reused for further of said data values in cyclic sequence, the storing of repetitive data values preserving the information from a disruption of electric power to said system during a storing procedure; the system further comprising computer means including comparator means, the comparator means connecting with said non-volatile memory for comparing information of one of said memory locations with information of a second of said memory locations to determine a presence of twice-repeated data values in said series of memory locations; and read-out means operative in response to said comparator means for obtaining from said non-volatile memory a last stored value of said data values from a series of said succession of data values, said last value being independent of said system disruption; and wherein said read-out means in operative after a reconnection of power subsequent to a power disruption, for reading out data values from two successive memory locations proceeding one memory location at a time; and said comparator means serves for testing the data values of the two successive memory locations, provided by the read-out means, for agreement with each other, said comparator means establishing a sequence of agreements and disagreements among the data values of successive pairs of the memory locations; and wherein said computer means provides identification of individual ones of the memory locations containing valid data determined on the basis of a sequence of agreements and disagreements sensed by said comparator means.

4. The system according to claim 3, wherein said storing means is driven by said comparator means for addressing said memory such that an address, a, of a memory location containing valid data is determined from the sequence of agreements and disagreements by means of an equation $a=j-1+x$, in which j is an address of a next-to-a-last memory position addressed; x, in a sequence of two disagreements and a single agreement, is equal to 0; x, in a sequence of three disagreements, is equal to $-2$; and x, in a sequence of two agreements is equal to $-1$; and wherein in other sequences, x is equal to 1.

5. The system according to claim 4, wherein a data value is a measured value to be displayed, and is fed to a display device before entry by said storing means in a subsequent memory location.

6. The system according to claim 3, wherein a data value is a measured value to be displayed, and is fed to a display device before entry by said storing means in a subsequent memory location.

7. A system for storing data to be presented on a display in a motor vehicle, the system comprising:

a non-volatile memory having a plurality of memory locations, the information to be stored comprising a succession of data values; and storing means for repetitively storing a data value in a first and a second memory location of a series of memory locations, a subsequent one of said data values being stored repetitively by said storing means at further times in a further two successive memory locations, there being an odd number of memory locations in said series; and wherein after a storing of data values in all the locations of said series, storing of a further data value is accomplished by replacing the value of said first location with said further data value, whereby said plurality of memory locations are reused for further of said data values in cyclic sequence, the storing of repetitive data values preserving the information from a disruption of electric power to said system during a storing procedure; the system further comprising read-out means, operative after a reconnection of power subsequent to a power disruption, for reading out data values from two successive memory locations proceeding one memory location at a time; and computer means including comparator means, the comparator means testing the data values of the two successive memory locations, provided by the read-out means, for agreement with each other, said comparator means establishing a sequence of agreements and disagreements among the data values of successive pairs of the memory locations; and wherein said computer means provides identification of individual ones of the memory locations containing valid data determined on a basis of a sequence of agreements and disagreements established by said comparator means; and wherein the data are measured values, said system including means for displaying a measured value after it has been entered in a first of the memory locations, the measured value then being written into a second of the memory locations by said storing means.

8. A system according to claim 7, wherein said means for displaying is a liquid crystal display.

9. A system according to claim 5, wherein said display device is a liquid crystal display.

10. A system according to claim 6, wherein said display device is a liquid crystal display.

* * * * *